United States Patent [19]
Lee et al.

[11] Patent Number: 5,353,245
[45] Date of Patent: Oct. 4, 1994

[54] MEMORY INTEGRATED CIRCUIT WITH BALANCED RESISTANCE

[75] Inventors: Kuo-Hua Lee; Janmye Sung, both of Lower Macungie Twp., Lehigh County, Pa.

[73] Assignee: AT&T Bell Laboratories, Murray Hill, N.J.

[21] Appl. No.: 111,033

[22] Filed: Aug. 24, 1993

Related U.S. Application Data

[63] Continuation of Ser. No. 814,951, Dec. 30, 1991, abandoned.

[51] Int. Cl.⁵ ..................... G11C 11/40; H01L 27/02
[52] U.S. Cl. ........................... 365/63; 365/154; 365/182; 257/395; 257/963; 257/904
[58] Field of Search ............... 365/63, 51, 148, 154, 365/182; 257/903, 904, 204, 207, 208, 390, 373, 903, 904

[56] References Cited

U.S. PATENT DOCUMENTS

| | | | |
|---|---|---|---|
| 4,459,687 | 7/1984 | Shiotari et al. | 365/63 |
| 4,535,426 | 8/1985 | Ariizumi et al. | 365/182 |
| 4,740,825 | 4/1988 | Saeki | 257/207 |
| 4,794,561 | 12/1988 | Hsu | 365/182 |
| 4,797,717 | 1/1989 | Ishibashi | 257/904 |

*Primary Examiner*—Eugene R. LaRoche
*Assistant Examiner*—Son Dinh
*Attorney, Agent, or Firm*—John T. Rehberg

[57] ABSTRACT

An integrated circuit, illustratively an SRAM, with pull down gates symmetrically positioned with respect to the ground line is disclosed. The symmetric positioning helps to insure cell stability.

3 Claims, 1 Drawing Sheet

MEMORY INTEGRATED CIRCUIT WITH BALANCED RESISTANCE

This application is a continuation of application Ser. No. 07/814951, filed on Dec. 30, 1991, abandoned.

TECHNICAL FIELD

This invention relates to semiconductor integrated circuits in general and, more particularly, to methods for manufacture of silicon integrated circuit memory devices.

BACKGROUND OF THE INVENTION

Static semiconductor memories are often referred to as SRAMs (Static Random Access Memories) because, unlike DRAMs, or Dynamic Random Access Memories, they do not require periodic refresh signals to restore their stored data.

A typical SRAM circuit is shown in FIG. 1. Operation of the circuit is well understood by those skilled in the art and will not be detailed here. Briefly, reference numerals 19 and 21 denote access transistors, while reference numerals 28 and 23 denote pull down transistors. Reference numerals 27 and 29 denote loads which, in this case, are thin film transistors. The drains of transistors 28 and 23 are connected to ground line 31. Bit lines are denoted by reference numerals 11 and 17, while word lines are denoted by reference numerals 26 and 25. (In many instances, a common, single-word line is employed.)

As memory cell sizes shrink and access speeds increase, the designer's task of providing a reliable cell has become increasingly more complicated.

SUMMARY OF THE INVENTION

The patent invention illustratively includes:
a conductor having a center line;
two gates positioned on opposite sides of said conductor, each of said gates defining a respective conductive path between the gate and the conductor, each conductive path being symmetrically positioned with respect to the conductor. Illustratively, the conductor may be a buried doped semiconductor line.

DETAILED DESCRIPTION

Figure 1:
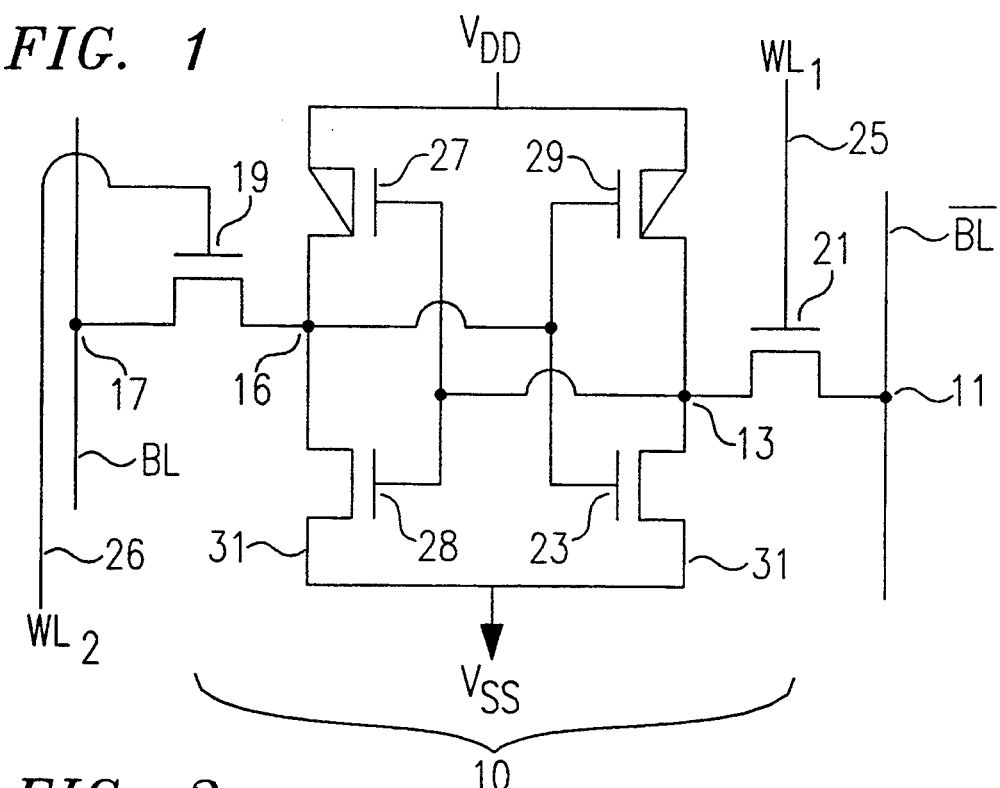
FIG. 1 is a circuit diagram illustrative of a typical SRAM circuit.
Figure 2:
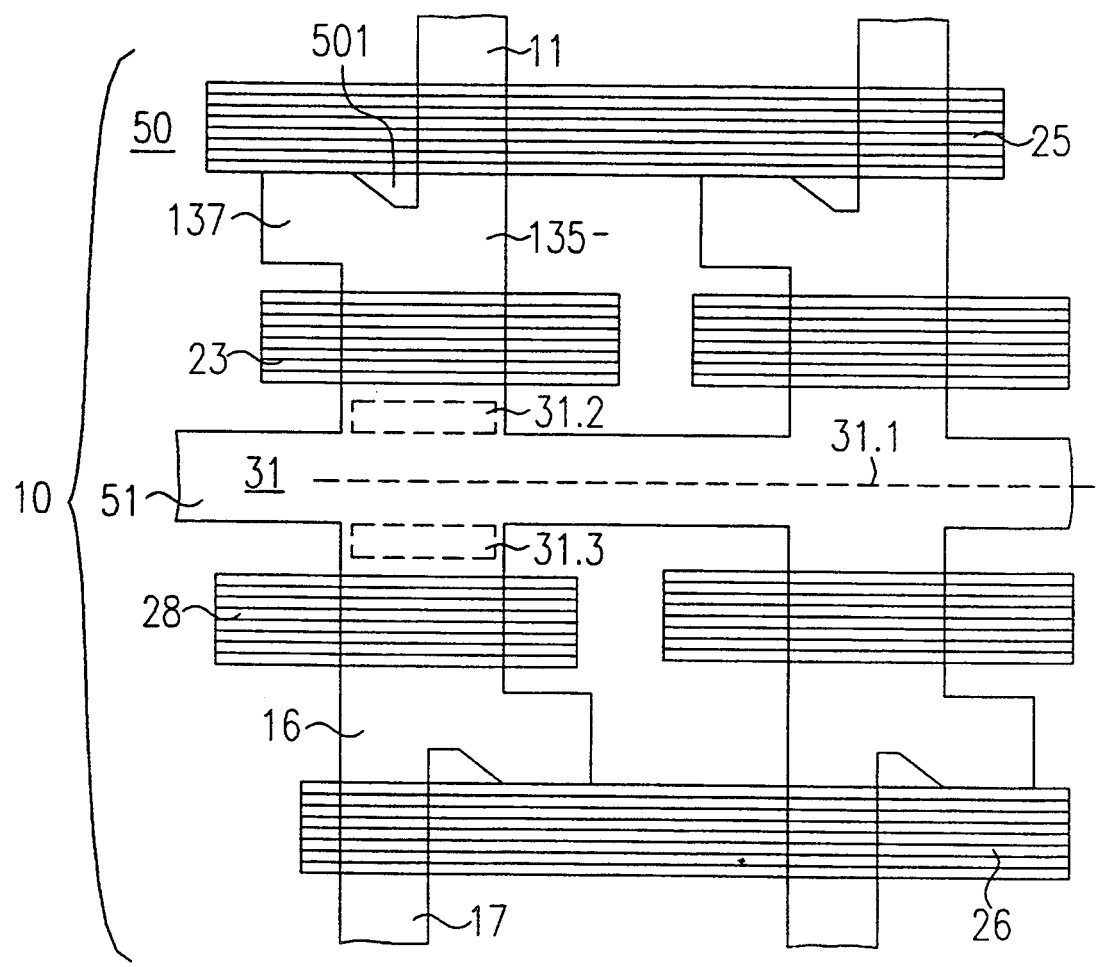
FIG. 2 is a cell layout diagram showing an illustrative embodiment of the present invention.

FIG. 2 illustrates in a top-down view conventionally used by those skilled in the art an illustrative embodiment of the present invention embodying the circuit of FIG. 1. (Those versed in the art will realize that interlevel dielectrics and gate oxides are not depicted in the diagram of FIG. 2.) Although FIG. 2 illustrates two identical cells, only one cell will be discussed for convenience. The diagram of FIG. 2 is drawn generally to scale.

As is known by those skilled in the art, reference numeral 50 and its contiguous areas denotes a field oxide. Reference numeral 51 denotes generally the thin ox regions formed by processes understood by those skilled in the art. Beneath each thin ox region is an appropriate semiconductor junction. Consequently, for simplicity in the discussion which follows, various thin ox regions will be associated with nodes in FIG. 1. Reference numerals 25 and 26 denote two word lines which serve cell 10. Both word lines 25 and 26 may be formed from polysilicon.

Polysilicon stripes 28 and 23 serve as the gates of the pull down transistors of FIG. 1. It will be noted that FIGS. 1 and 2 depict a cell accessed by two separate word lines. The cell is somewhat elongate in the vertical direction while being comparatively narrow in the horizontal direction.

Junction 31 is a buried layer ground line denoted by VSS in FIG. 1. Junction 31 may be formed by, for example, ion implantation through a mask.

It will be noted in FIG. 2 that pull down gates 23 and 28 generally define current paths through the thin ox region denoted, respectively, by reference numerals 31.2 and 31.3. Current paths 31.2 and 31.3 are symmetrically positioned with respect to ground line junction 31. More specifically, current paths 31.2 and 31.3 are symmetrically positioned with respect to the center line 31.1 of ground line junction 31. Consequently, the cell of FIGS. 1 and 2 exhibits a balanced ground resistance. Current flowing to ground from pull down transistor 28 sees the same resistance as current flowing to ground from pull down transistor 23.

In general, in an SRAM cell, the lack of balanced resistance may contribute to cell instability. Generally, cells which have a metallic ground line, have very low ground resistance, may not employ the present invention. However, as the ground line size decreases, the metallic ground line resistance increases and it becomes increasingly important that the cell has balanced ground resistance.

Details of the completion of the cell are indicated in co-pending application filed by the same inventors, assigned to the same assignee, and filed of even date herewith, entitled "Memory Integrated Circuit," and incorporated herein by reference.

We claim:
1. A semiconductor integrated circuit comprising:
at least one memory cell, said cell comprising
a buried conductor;
first and second gates positioned on opposite sides of said conductor;
a first junction between said first gate and said buried conductor, said first gate controlling current flow from said first junction to said conductor;
a second junction between said second gate and said buried conductor, said second gate controlling current flow from said second junction to said conductor.
2. The integrated circuit of claim 1 in which said buried conductor is a ground line.
3. The integrated circuit of claim 1 in which said first and second gates are gates of SRAM pull down transistors.

* * * * *